US007732915B2

(12) United States Patent
Dangelmaier et al.

(10) Patent No.: US 7,732,915 B2
(45) Date of Patent: Jun. 8, 2010

(54) SEMICONDUCTOR SENSOR DEVICE WITH SENSOR CHIP AND METHOD FOR PRODUCING THE SAME

(75) Inventors: Jochen Dangelmaier, Beratzhausen (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 169 days.

(21) Appl. No.: 11/526,884

(22) Filed: Sep. 26, 2006

(65) Prior Publication Data
US 2007/0069354 A1 Mar. 29, 2007

(30) Foreign Application Priority Data
Sep. 26, 2005 (DE) .................. 10 2005 046 008

(51) Int. Cl.
*H01L 23/04* (2006.01)
(52) U.S. Cl. ................. 257/704; 257/E23.181
(58) Field of Classification Search .................. 257/704
See application file for complete search history.

(56) References Cited
U.S. PATENT DOCUMENTS

| | | | | |
|---|---|---|---|---|
| 5,827,999 A * | 10/1998 | McMillan et al. | ........... | 174/539 |
| 5,929,516 A | 7/1999 | Heerman et al. | | |
| 6,075,289 A * | 6/2000 | Distefano | .................. | 257/732 |
| 6,100,595 A * | 8/2000 | Jaouen et al. | ............... | 257/778 |
| 6,351,389 B1 * | 2/2002 | Malladi | ....................... | 361/760 |
| 6,351,390 B1 | 2/2002 | Mayer et al. | | |
| 6,432,737 B1 | 8/2002 | Webster | | |
| 2001/0028102 A1 * | 10/2001 | Hacke | ......................... | 257/678 |
| 2003/0067070 A1 * | 4/2003 | Kwon et al. | ................ | 257/706 |
| 2003/0067755 A1 * | 4/2003 | Haimerl et al. | ............. | 361/773 |
| 2005/0127527 A1 | 6/2005 | Haimerl et al. | | |

FOREIGN PATENT DOCUMENTS

| | | |
|---|---|---|
| DE | 10016132 A1 | 10/2001 |
| DE | 10239080 A1 | 3/2004 |
| DE | 10330739 A1 | 9/2004 |
| DE | 102004045854 A1 | 4/2006 |
| DE | 10059178 A1 | 9/2006 |
| DE | 10239089 A1 | 9/2006 |
| DE | 19754616 A1 | 9/2006 |
| KR | 2003048679 A | 6/2003 |
| KR | 2004080558 A | 9/2004 |

* cited by examiner

*Primary Examiner*—Sue Purvis
*Assistant Examiner*—Benjamin P Sandvik
(74) *Attorney, Agent, or Firm*—Edell, Shapiro & Finnan, LLC

(57) ABSTRACT

A semiconductor sensor device includes a sensor chip. The sensor chip includes a sensor region and contact areas on its upper side and is further arranged in a cavity housing. The cavity housing includes side walls, a housing bottom, a cavity, external contacts on the outside of the cavity and contact pads on an upper side of the housing bottom facing the cavity. The sensor chip is embedded into a rubber-elastic plastic composition within the cavity of the cavity housing such that the sensor region of the sensor chip faces the housing bottom and the contact areas of the sensor chip are electrically connected to the contact pads on the housing bottom via elastic flip-chip contacts.

16 Claims, 8 Drawing Sheets

SEMICONDUCTOR SENSOR DEVICE WITH SENSOR CHIP AND METHOD FOR PRODUCING THE SAME

CROSS REFERENCE TO RELATED APPLICATIONS

This application claims priority under 35 U.S.C. §119 to Application No. DE 102005046008.9 filed on Sep. 26, 2005, entitled "Semiconductor Sensor Device with Sensor Chip and Method for the Production Thereof," the entire contents of which are hereby incorporated by reference.

FIELD OF THE INVENTION

The claimed device relates to a semiconductor sensor with sensor chip and a method for producing the same.

BACKGROUND

Semiconductor sensor devices are known in the art. FIG. 8 shows a schematic cross section through a known semiconductor sensor device, this semiconductor sensor device representing a microelectromechanical module 51 comprising a sensor housing 117 and comprising a sensor 52.

A sensor region 113 is formed by a cutout 57 in a plastic housing composition 56 and has flat conductor ends 111 surrounding a central position 115 on the bottom 128 of the cutout. A further part 120 of the flat conductors 59 projects from the sensor housing 117 and forms external contacts 121 corresponding to the sensor region 113. Various sensors 52 can be arranged into a sensor housing 117 of this type on the central position 115, the central position 115 having a metallic chip island 122 on the bottom 128.

A pressure sensor 124 produced on a silicon base 125 is fixed on the chip island 122 and reacts to pressure fluctuations which are transmitted to the pressure-sensitive region of the pressure sensor 124 by a rubber-elastic plastic composition 58. The flexure of a silicon diaphragm 126 brings about a capacitive change between the upper side of the silicon diaphragm 126 and a rigid metal-plated glass plate 138 arranged above the latter, so that pressure fluctuations can be detected via the capacitive change. For this purpose, the electrodes of the pressure sensor 124 are connected to a control and evaluation semiconductor chip 53 via bonding connections 110 and corresponding flat conductors 59.

A semiconductor sensor device of this type has the disadvantage that the silicon base 125 of the silicon diaphragm 126 is fixed on a chip island 122 which, for its part, is held by the bottom 128 made from a plastic housing composition 56. Since the housing bottom 128 made from the plastic housing composition 56 has a significantly larger coefficient of thermal expansion than the silicon base 125 of the silicon diaphragm 126, there is the risk of thermal stresses between the material of the silicon base 125 and the material of the plastic housing composition 56 prestressing the silicon diaphragm in such a way that the sensor characteristic is impaired.

If the pressure measurements are not based on a capacitive coupling, but rather on a diaphragm equipped with piezoelements, then thermomechanical stresses have an even more significant effect on the measurement signals since piezoelements of this type generate erroneous signals in the event of thermomechanical stresses.

Furthermore, the known sensor device of this micromechanical module 51 has the disadvantage that the rubber-elastic plastic composition 58 above the pressure-sensitive region and within the cutout 57 has a variable contour that is not unambiguously defined, which likewise impairs the sensor characteristic, especially as the sensor sensitivity depends on the thickness of the rubber-elastic plastic composition 58 arranged above the diaphragm 126.

When fitting the bonding connections 110, too, mechanical forces act on the sensor chip, whereby the characteristic curve may be impaired undesirably, in part also uncontrollably. Even if sensitive sensor areas, as in the prior art, are covered with soft rubber-elastic materials, the dispensing processes involved are critical, especially as the sensitivity of the sensors depends appreciably on the height of the material dispensed over a sensor diaphragm.

SUMMARY

The present device relates to a semiconductor sensor device with sensor chip and a method of producing the same. The sensor chip includes a sensor region and contact areas on its upper side and is arranged in a cavity housing. The cavity housing includes: side walls, a housing bottom, external contacts on the outside of the cavity and contact pads on an upper side of the housing bottom facing the cavity. The sensor chip is embedded into a rubber-elastic plastic composition within the cavity of the cavity housing such that the sensor region of the sensor chip faces the housing bottom and the contact areas of the sensor chip are electrically connected to the contact pads on the housing bottom via elastic flip-chip contacts The above and still further features and advantages of the present device will become apparent upon consideration of the following definitions, descriptions and descriptive figures of specific embodiments thereof, wherein like reference numerals in the various figures are utilized to designate like components. While these descriptions go into specific details of the device, it should be understood that variations may and do exist and would be apparent to those skilled in the art based on the descriptions herein.

BRIEF DESCRIPTION OF THE DRAWINGS

The device is explained in more detail below with reference to exemplary embodiments, where.

DETAILED DESCRIPTION

Figure 1:
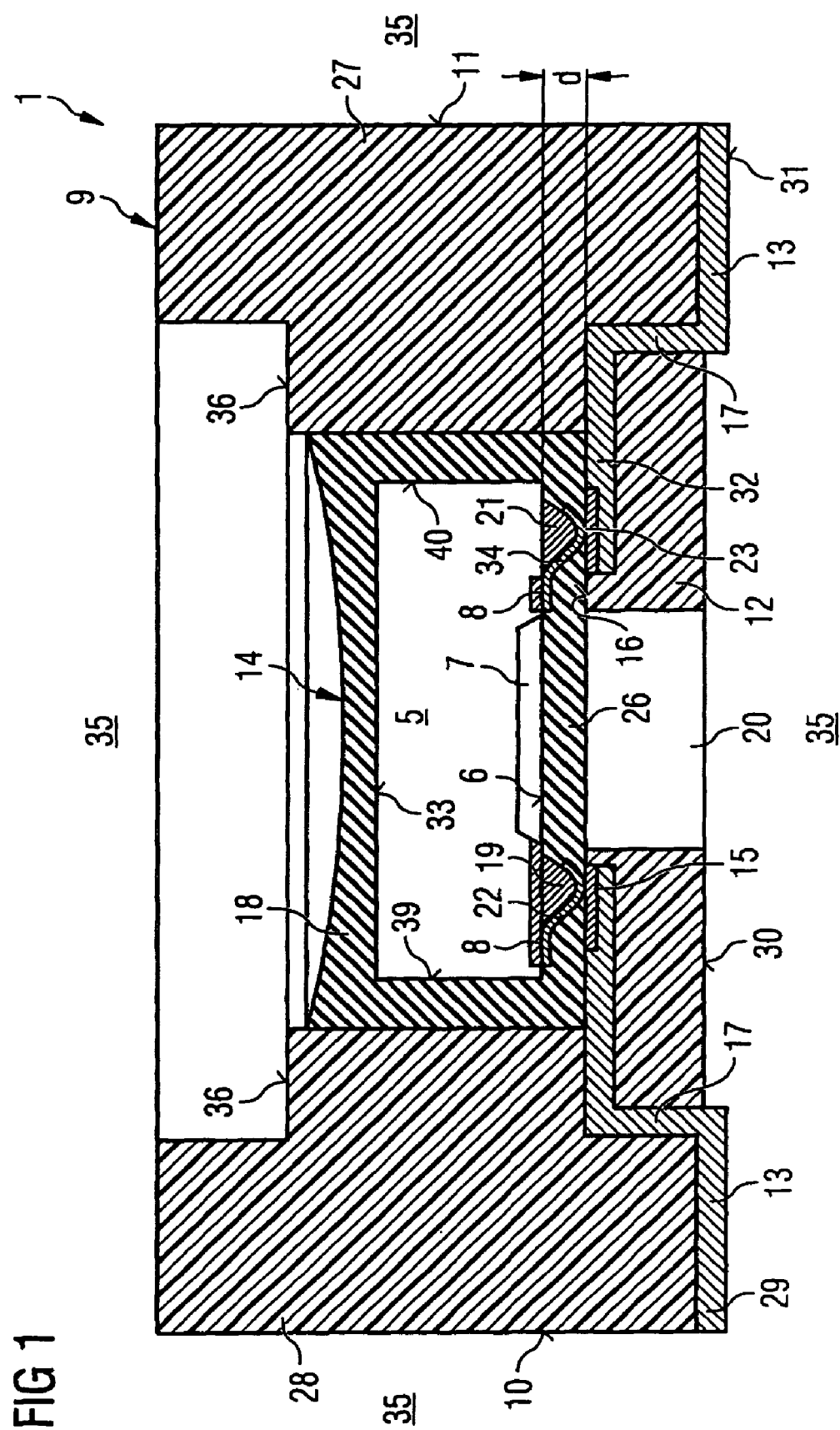
FIG. 1 shows a schematic cross section through a semiconductor sensor device of a first embodiment.

The device provides a semiconductor sensor with sensor chip and a method for the production of the same. The device overcomes the problems, as experienced with the known art, with the rigid cohesive connection between the semiconductor sensor base and a housing bottom and to avoids the coupling of thermomechanical stresses into the semiconductor sensor chip and the sensor region of the semiconductor sensor chip.

The device provides a semiconductor sensor comprising a sensor chip, which has a sensor region and contact areas on its upper side. Furthermore, the semiconductor sensor device has a cavity housing, which has side walls and a housing bottom, external contacts outside the cavity of the cavity housing being electrically connected via through contacts to contact pads on an upper side of the housing bottom facing the cavity. Moreover, the cavity is filled with a rubber-elastic plastic composition, in which the sensor chip is at least partly embedded. According to the device, the sensor region of the sensor chip faces the housing and the contact areas of the sensor chip are connected to elastic flip-chip contacts which are electrically connected to the contact pads on the housing bottom.

A semiconductor sensor device of this type displays improved sensitivity of the sensor component. The elastic flip-chip contacts constitute a particularly effective thermomechanical buffer between the housing bottom and the sensor chip. The use of the rubber-elastic material does not just serve for encapsulating the sensor chip, but supplies, on account of the orientation of the sensor region toward the housing bottom, a uniformly sharply defined distance between the upper side of the sensor chip and the housing bottom, whereby the thickness of the rubber-elastic layer over the sensor area is likewise sharply defined and promotes a high sensor sensitivity. Furthermore, elastic flip-chip contacts mechanically decouple the sensor chip from the cavity housing since the sensor chip floats as it were in a rubber-elastic gel and, consequently, strains of the cavity housing and forces which act on the cavity housing do not impair the measurement results of the sensor chip.

Furthermore, the device allows the housing dimensions to be reduced in comparison with wire bonding solutions since the wire bonding loops are omitted and the space requirement for the wire bonding operation can likewise be obviated. In addition, the reliability is improved since the cycling durability is increased as a result of the introduction of the thermomechanical buffers on account of the elastic flip-chip contacts. Moreover, undesirable preliminary damage when fitting bonding connections to the sensor chip is practically precluded.

In one preferred embodiment, the housing bottom has at least one housing bottom opening. Direct contact between the sensor region of the sensor chip and the surroundings can be ensured via the housing bottom opening. Moreover, the sensitivity of the sensor region is increased since the interaction between surroundings and sensor region is now not effected via the rear side of the sensor chip.

It is furthermore provided that the elastic flip-chip contacts have rubber-elastic plastic humps on which are arranged conduction paths up to the hump peak. Flip-chip contacts of this type and further embodiments of elastic contacts of this type are known in the art. It is furthermore provided that the flip-chip contacts have electrodeposited elastic fibers such as are known in the art. Elastic fibers of this type have the advantage that they can be deposited directly on the contact areas of the sensor chip and thus enable an area reduction.

Furthermore, spring-elastic bonding wire portions may also be used as elastic flip-chip contacts, a bonding wire end bent in S-shaped fashion being bonded onto the contact area of the sensor chip and being coated with a spring-elastic alloy, for example made from spring bronze.

In a further embodiment, the areal extent of the housing bottom opening is adapted to the area of the sensor region. On the other hand, it is also possible to provide, instead of an individual housing bottom opening having a large area, a plurality of bottom openings which are adapted to the area of the sensor region and are operatively connected to the sensor region of the sensor chip via the rubber-elastic plastic composition.

Preferably, a silicone gel is used as rubber-elastic plastic composition, the rubber-elastic composition being optically transparent for optical sensors. As already mentioned above, a uniformly thin layer of the rubber-elastic plastic composition is preferably arranged between the upper side of the housing bottom and the sensor region in order to improve the sensitivity and reliability of the semiconductor sensor device.

In a further preferred embodiment, the side walls of the cavity housing form an injection-molding frame made from a filled plastic housing composition. Filled plastic housing compositions of this type are distinguished by their robustness and stability, ceramic filler particles ensuring that the coefficient of thermal expansion of the plastic housing composition is reduced, thereby reducing the difference with respect to the coefficient of expansion of the semiconductor base of the sensor chip, in particular the silicon base of a sensor chip.

In a further embodiment, the external contacts are flat conductors arranged on an underside of the housing bottom. Whereas the external flat conductors usually project from the housing, what is achieved with this solution is that the semiconductor sensor device is surface-mountable without the need for an additional area of a superordinate circuit board for the mounting of the external flat conductors.

The external flat conductors with their external contact areas on the underside of the housing bottom extend through the housing bottom to internal flat conductors with contact pads on the upper side of the housing bottom in the cavity region. This flat conductor construction has the advantage that for the production of the semiconductor sensor devices it is possible to use a flat conductor leadframe onto which a plurality of semiconductor sensor devices can be produced in parallel.

A method for the production of a plurality of semiconductor sensor devices has the following method steps. The first step involves producing a semiconductor wafer with a multiplicity of sensor chip positions arranged in rows and columns, contact areas and at least one sensor chip region being arranged in the sensor chip positions. Elastic flip-chip contacts are subsequently positioned on the contact areas and/or in a manner electrically connected to the contact areas in the semiconductor chip positions. The semiconductor wafer can then be separated into a multiplicity of sensor chips.

The flip-chip contacts of individual sensor chips are then electrically connected to contact pads on a circuit carrier having a plurality of semiconductor sensor device positions. In this case, the contact pads are arranged on a housing bottom of a cavity housing and are surrounded by side walls of the cavity housing. Afterward, the sensor chips are at least partly packaged into a rubber-elastic plastic composition within the cavity of the cavity housing. Subsequently, the semiconductor sensor device positions of the circuit carrier are separated into individual semiconductor sensor devices.

This method has the advantage that a plurality of semiconductor sensor devices can be produced simultaneously and in parallel on a circuit carrier. The circuit carrier may be a wiring substrate with a plurality of semiconductor device positions, or a flat conductor leadframe that is likewise suitable for the parallel production of a plurality of semiconductor sensor devices.

In one preferred exemplary implementation of the method, for the purpose of applying elastic flip-chip contacts, rubber-elastic plastic humps are applied to the semiconductor wafer adjacent to the contact areas of the sensor chip positions and conduction paths are laid from the contact areas in the semiconductor chip positions to the hump peaks via selective metallization. With this method variant, the envisaged elastic flip-chip contacts may already be provided on the semiconductor wafer.

Alternatively, for the purpose of applying elastic flip-chip contacts, elastic contact fibers may be chemically deposited or electrodeposited on the contact areas of the semiconductor wafer in the sensor chip positions. The method for the production of elastic contact fibers of this type is known in the art and supplies contact fibers that can be precisely defined in terms of length and cross section for elastic connections between a semiconductor chip and the housing bottom of the semiconductor sensor device that is available here.

Furthermore, for the purpose of applying elastic flip-chip contacts, bonding wire portions may be bonded on the contact areas of the semiconductor wafer in the semiconductor chip positions and the bonding wire ends of the bonding wire portions are bent in serpentine fashion. For this purpose, the bonding wire may already have been coated with a spring-elastic metal, such as a spring bronze, beforehand, or be coated with a spring-elastic material of this type subsequently.

It is furthermore provided that for electrical connection purposes, the flip-chip contacts of individual sensor chips are fixed on contact pads of the circuit carrier via a conductive adhesive. This method variant has the advantage that extremely low mounting forces are exerted on semiconductor chip during connection to the contact pads of the housing, with the result that the characteristic of the sensor is practically not impaired. Another possibility consists in fixing the flexible flip-chip contacts of individual sensor chips on the contact pads of the circuit carrier by means of soldering. During this operation, however, thermomechanical stresses may be induced in the semiconductor chip, which might impair the characteristic of the sensor.

For the purpose of producing cavity housings, a flat conductor leadframe is preferably provided as circuit carrier, to which the cavity housings are applied in the semiconductor sensor device positions via injection molding. The flat conductor leadframe technique is a reliably controllable technique for producing semiconductor sensor devices, and in particular cavity housings on flat conductors with suitable quality. An alternative to the flat conductor leadframe technique is the provision of a wiring substrate as circuit carrier, in which case, too, corresponding cavity housings can be applied on the wiring substrate in the semiconductor sensor device positions via injection molding.

A dispensing technique is preferably used for packaging the sensor chips into a rubber-elastic plastic composition, the dispensing technique advantageously exerting only minimal forces on the sensor chip. For this purpose, it is advantageous if the housing bottom opening is not introduced until after the dispensing operation.

FIG. 1 shows a schematic cross section through a semiconductor sensor device 1 in accordance with a first embodiment. The semiconductor sensor device 1 has a rigid injection-molding frame 27 comprising side walls 10 and 11 surrounding a cavity 14, the cavity 14 being closed off by a housing bottom 12. In this embodiment, the housing bottom 12 and injection-molding frame 27 include a filled plastic housing composition 28, the advantages of which have already been discussed above. In the cavity 14, a sensor chip 5 is embedded in a rubber-elastic plastic composition 18, which is soft and compliant. The upper side 6 of the sensor chip 5 faces the housing bottom 12. The upper side 6 includes contact areas 8 adjacent to a sensor region 7. The contact areas 8 are electrically connected to elastic and compliant flip-chip contacts 19.

Internal flat conductors 32 with contact pads 15 are arranged on the rigid housing bottom 12, the contact pads 15 being electrically connected to the elastic flip-chip contacts 19. The elasticity and compliance of the flip-chip contacts used in the first embodiment of the invention are based on a rubber-elastic plastic hump 21 arranged onto the sensor chip upper side 6 adjacent to a contact area 8. A conduction path 22 extends from the contact area 8 up to the hump peak 23 of the rubber-elastic plastic hump 21. The conduction path 22 is cohesively and electrically conductively connected to the contact pads 15 of the internal flat conductors 32 at the plastic hump peak 23.

A conductive adhesive which exerts no thermomechanical stresses on the conduction paths 22 and on the sensor chip 5 is preferably used for a cohesive, electrically conductive connection. This relatively flexible connection between the rigid cavity housing 9 and the elastic compliant contact elements 34 that are used here as flip-chip contacts 19 ensures that the sensor chip 5 is suspended in the rubber-elastic plastic composition 18 and is mechanically decoupled from the rigid cavity housing 9.

A corruption of the measured values or of the signal data is reduced by this flexible and compliant electrical connection between the rigid cavity housing 9 and the sensor chip 5, with the result that the characteristic of the sensor chip is not impaired in the event of thermomechanical stresses which occur on account of different coefficients of thermal expansion of the materials involved. What is more, a defined distance d between the upper side 6 of the sensor chip and the housing bottom 12 is achieved via the elastic flip-chip contacts, thereby ensuring a uniformly thin coating 26 of the sensor region 7 by the rubber-elastic plastic composition 18, which likewise promotes the sensitivity and reliability of the semiconductor sensor device 1.

In order to pass the measurement signals to the outside via the flexible flip-chip contacts 19, the semiconductor sensor device 1 of this first embodiment has flat conductors which are arranged as internal flat conductors 32 on the upper side 16 of the housing bottom 12 and undergo transition into a through contact 17 which leads through the housing bottom 12 onto the underside 30 of the housing bottom 12, where it forms external flat conductors 29 as external contacts 13 with an external contact area 31. Via the external contact area 31 there is access to the sensor chip 5 in the cavity 14 of the cavity housing 9.

In order to improve the coupling of the sensor region 7 to the surroundings 35, the semiconductor sensor device 1 has a housing bottom opening 20, the areal extent of which corresponds to the area of the sensor region 7 of the sensor chip 5. The cavity 14 may be closed by a covering, for which purpose cutouts 36 are provided in the side walls 10 and 11, into which cutouts a rear side covering of this type can be fitted.

Figure 2:
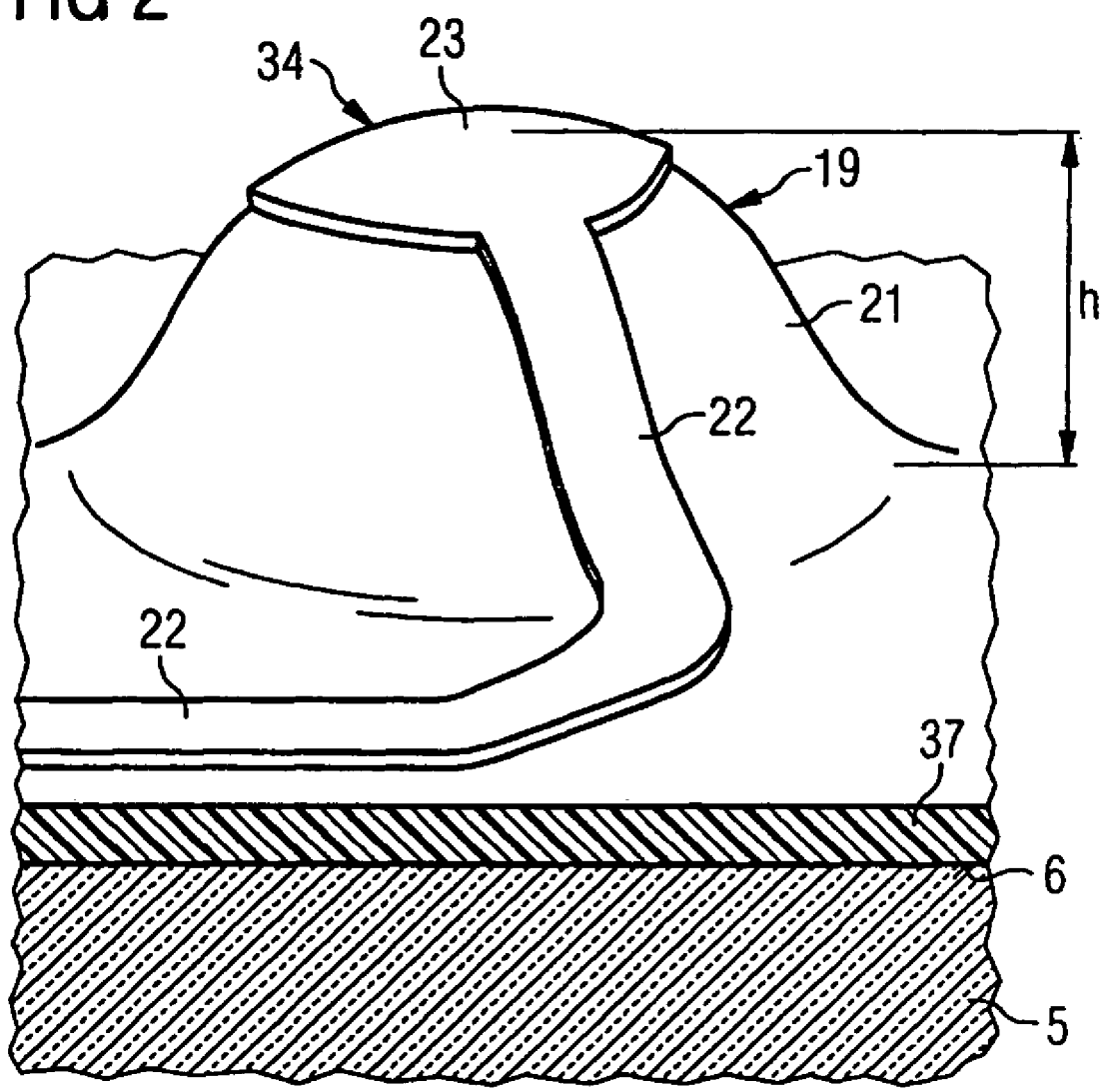
FIG. 2 shows a schematic perspective view of an elastic compliant contact element.

FIG. 2 shows a schematic perspective view of an elastic compliant contact element 34. In the first embodiment in accordance with FIG. 1, the compliant contact element 34 is used as an elastic and compliant flip-chip contact 19 on the upper side 6 of the sensor chip 5. In order to ensure the compliance, the elastic and compliant contact element 34 includes a rubber-elastic plastic hump 21, onto which a conduction path 22 leads up to its peak 23. Measurement signals can be forwarded to the external contacts of the semiconductor sensor device via the conduction path 22. The conduction paths 22 additionally connect the hump peak 23 to contact areas on the upper side of the sensor chip 5 and for this purpose are arranged on an insulation layer 37 which, for its part, leaves exposed the contact areas on the upper side 6 of the semiconductor chip 5. Compliant contact elements 34 of this type are well known in the art.

Figure 3:
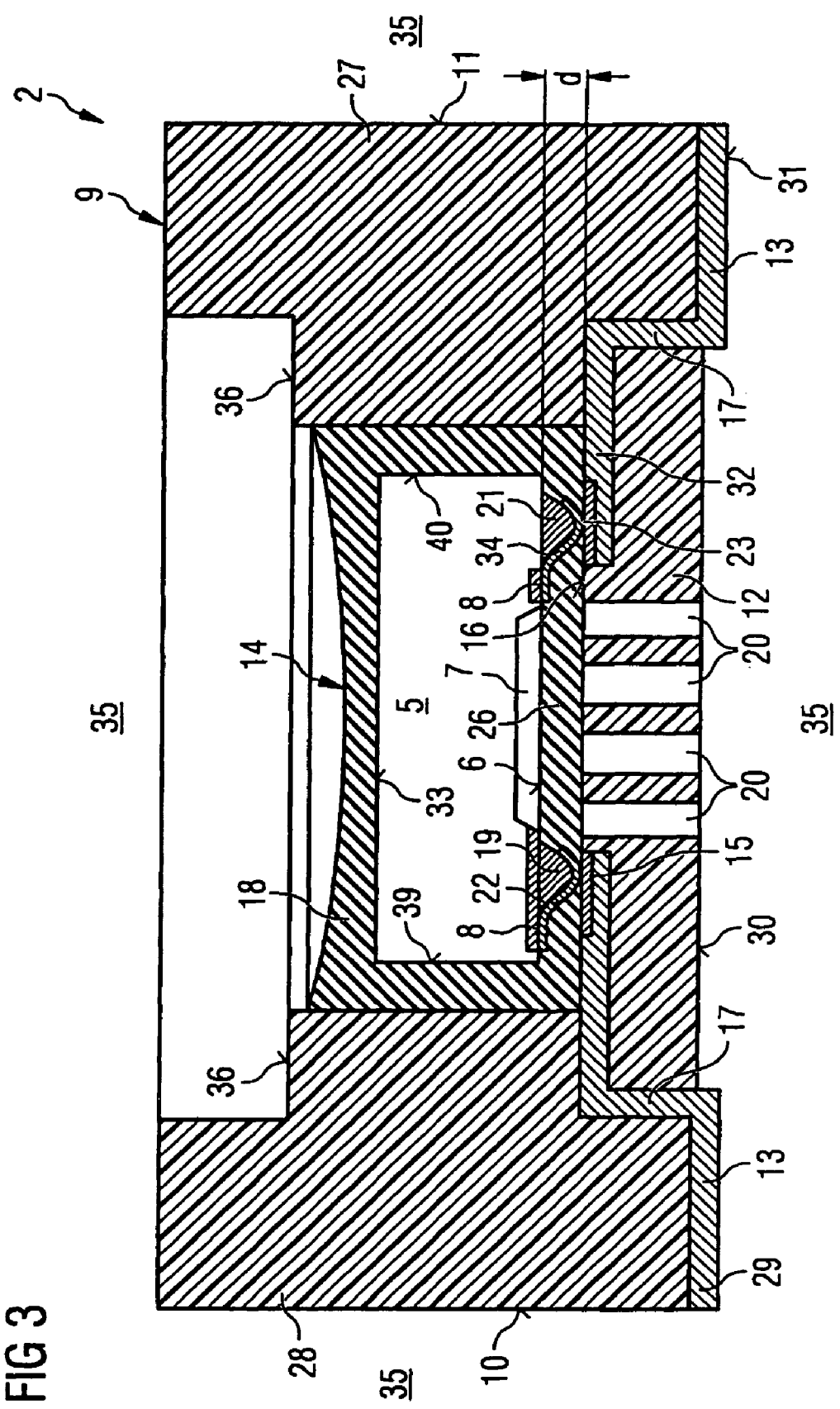
FIG. 3 shows a schematic cross section through a semiconductor sensor device of a second embodiment.

FIG. 3 shows a schematic cross section through a semiconductor sensor device 2 of a second embodiment. Components having functions identical to those in FIG. 1 are identified by identical reference symbols and are not explained separately. The difference between the second embodiment and the first embodiment as shown in FIG. 1 is that a plurality of housing bottom openings 20 are provided in the housing bottom 12, the openings disposed opposite the sensor region 7 of the sensor chip 5. It is not necessary for the housing bottom openings 20 to be provided in the housing bottom from the outset, but rather may be subsequently introduced into the housing bottom 12 via, e.g., laser ablation or other techniques. The subsequent introduction of the housing bottom openings 20 has the advantage that it is possible to ensure a defined thickness for the rubber-elastic composition 18 on the sensor region 7.

Figure 4:
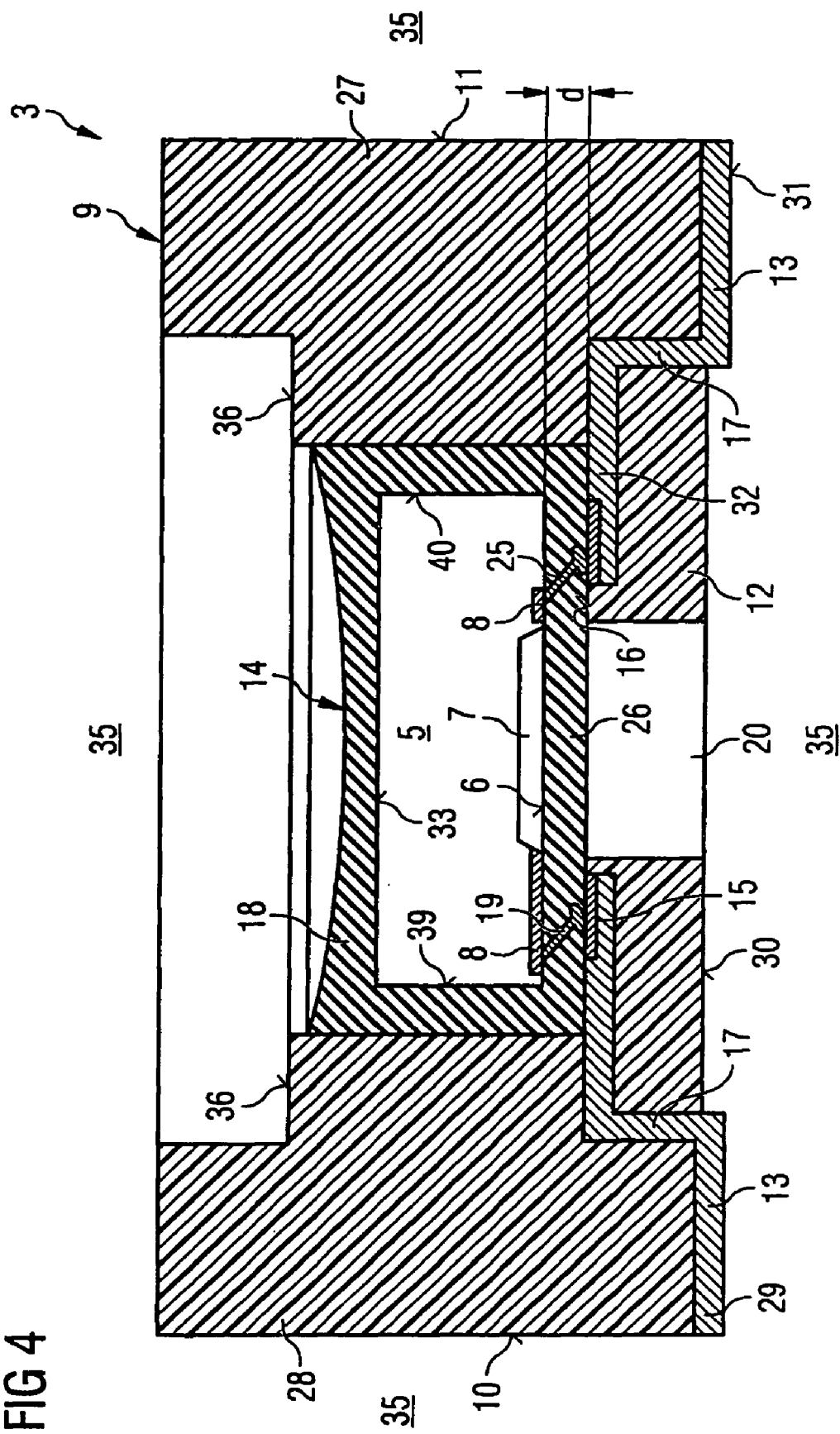
FIG. 4 shows a schematic cross section through a semiconductor sensor device of a third embodiment.

FIG. 4 shows a schematic cross section through a semiconductor sensor device 3 of a third embodiment. Components having functions identical to those in the previous figures are identified by identical reference symbols and are not explained separately. The third embodiment differs from the previous embodiments in that elastic contact fibers 25 are used as elastic flip-chip contacts 19. The elastic contact fibers 25 may be electrodeposited or deposited chemically directly on the contact areas 8 of the upper side 6 of the sensor chip 5. For this purpose, the upper side is correspondingly masked with a sacrificial layer that only leaves exposed capillary openings to the contact areas 8, so that from there the capillary openings can be filled to form contact fibers galvanically or in electroless fashion via chemical deposition. Elastic and compliant contact elements of this type are known in the art.

After the removal of the masking sacrificial layer, the contact fibers 25 are retained and can be used as flexible flip-chip contacts 19 in this third embodiment. The compliance and elasticity of the contact fibers 25 can be set via the angle at which the contact fibers 25 grow on the contact areas 8. Moreover, the elasticity is determined by the thickness of the contact fibers 25, which may likewise be set via the mask made of the sacrificial material.

Figure 5:
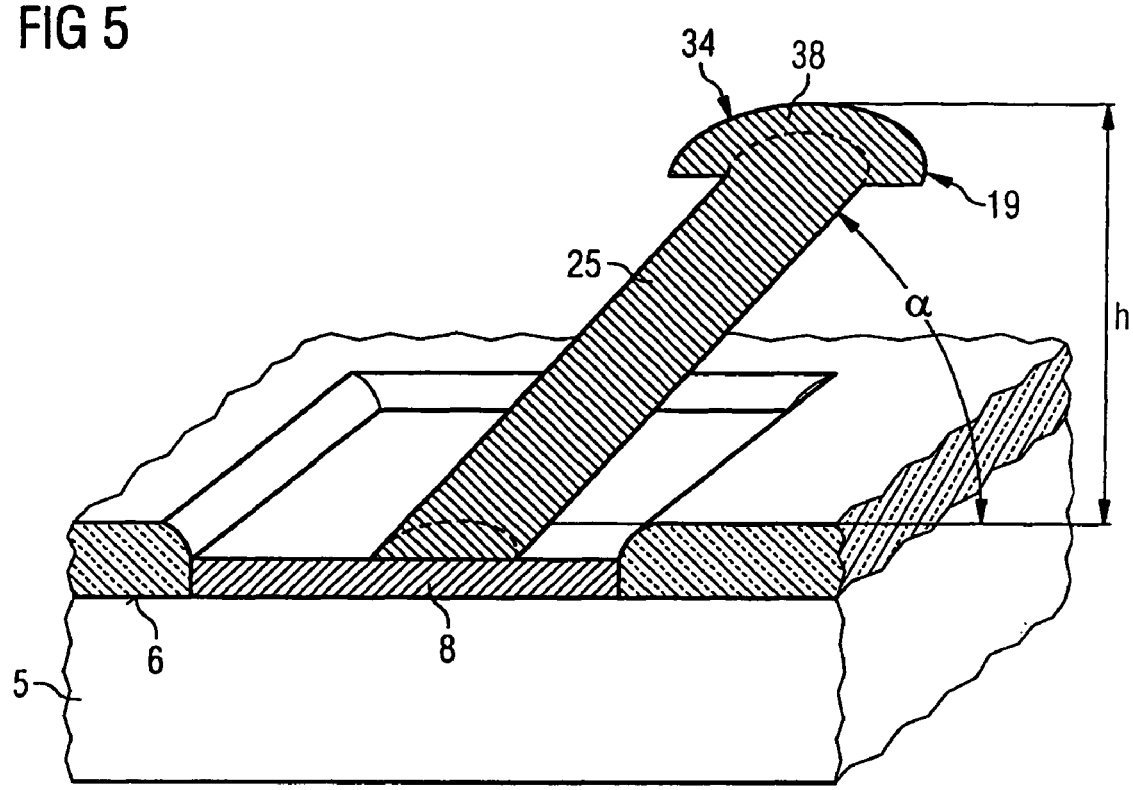
FIG. 5 shows a schematic perspective view of an elastic contact fiber.

FIG. 5 shows a schematic perspective view of an elastic contact fiber 25 used as a flip-chip contact 19 in the third embodiment. In this illustration, the sacrificial layer has been removed and the capillary opening situated in the sacrificial layer has already been filled galvanically with a contact material in order to form the elastic contact fiber 25. During the electrodeposition, a mushroom-cap-shaped or nail-head-shaped thickening 38 arises on the upper side of the sacrificial layer, and it facilitates the connection to corresponding contact pads in the cavity housing.

In addition, the compliance of such an elastic contact fiber 25 is improved by depositing the contact fiber 25 at an angle α. Such a compliant contact element 34 makes it possible to bridge a height h between the upper side of the sensor chip 5 and the upper side of the housing bottom. A further advantage of this elastic contact fiber 25 is that it can be deposited directly on the contact area 8 on the upper side 6 of the sensor chip 5, with the result that conduction paths such as are required in the first and second embodiments are obviated in this third embodiment.

Figure 6:
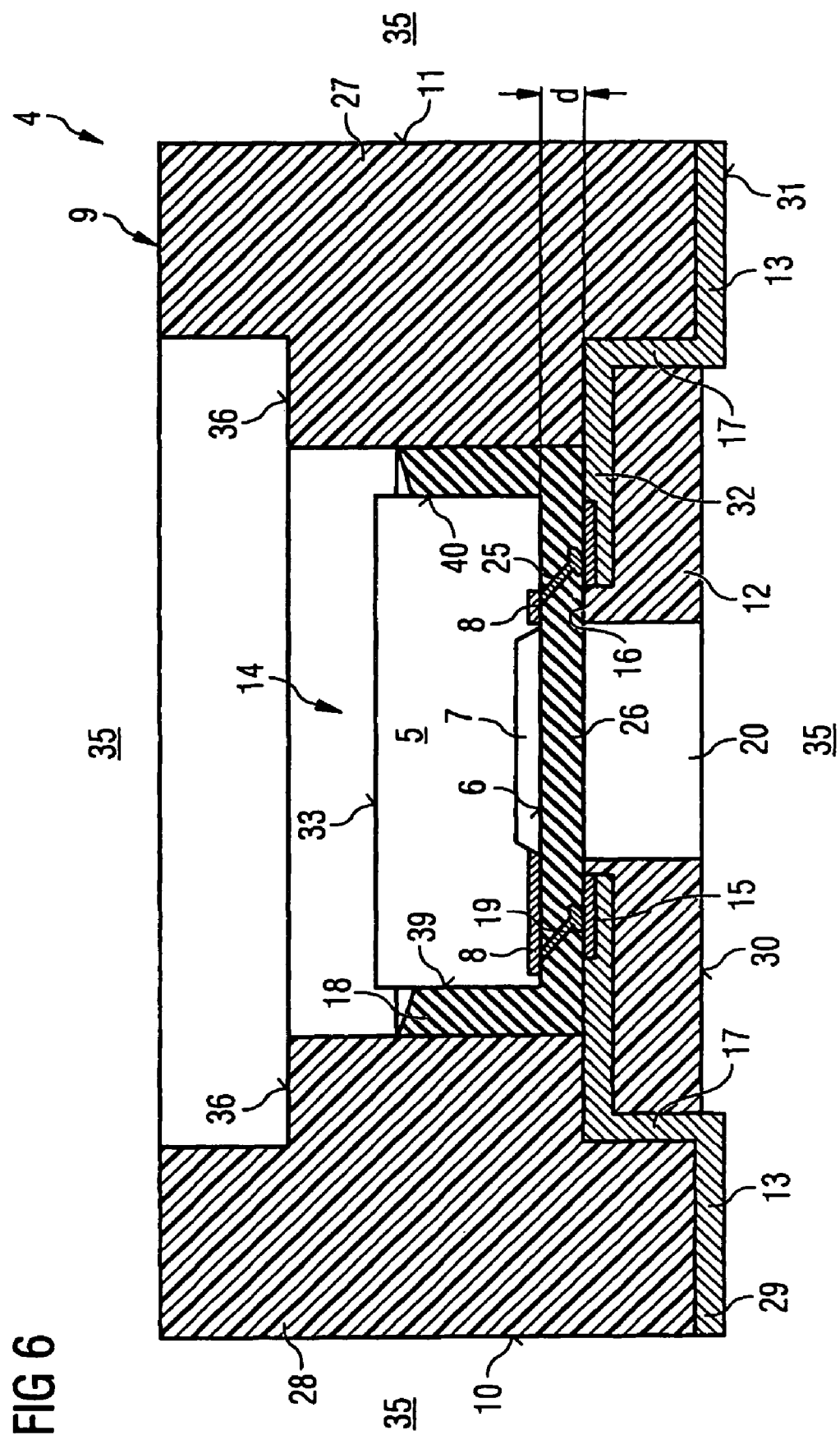
FIG. 6 shows a schematic cross section through a semiconductor sensor device in accordance with a fourth embodiment.

FIG. 6 shows a schematic cross section through a semiconductor sensor device 4 in accordance with a fourth embodiment. Components having functions identical to those in the previous figures are identified by identical reference symbols and are not explained separately.

The fourth embodiment differs from the previous embodiments in that the rear side 33 of the sensor chip 5 is exposed and the rubber-elastic plastic composition 18 only covers the edge sides 39 and 40 and also the upper side 6 of the sensor chip 5. This embodiment has the advantage that the sensor chip has greater freedom of movement and reaction in the event of mechanical loading.

Figure 7:
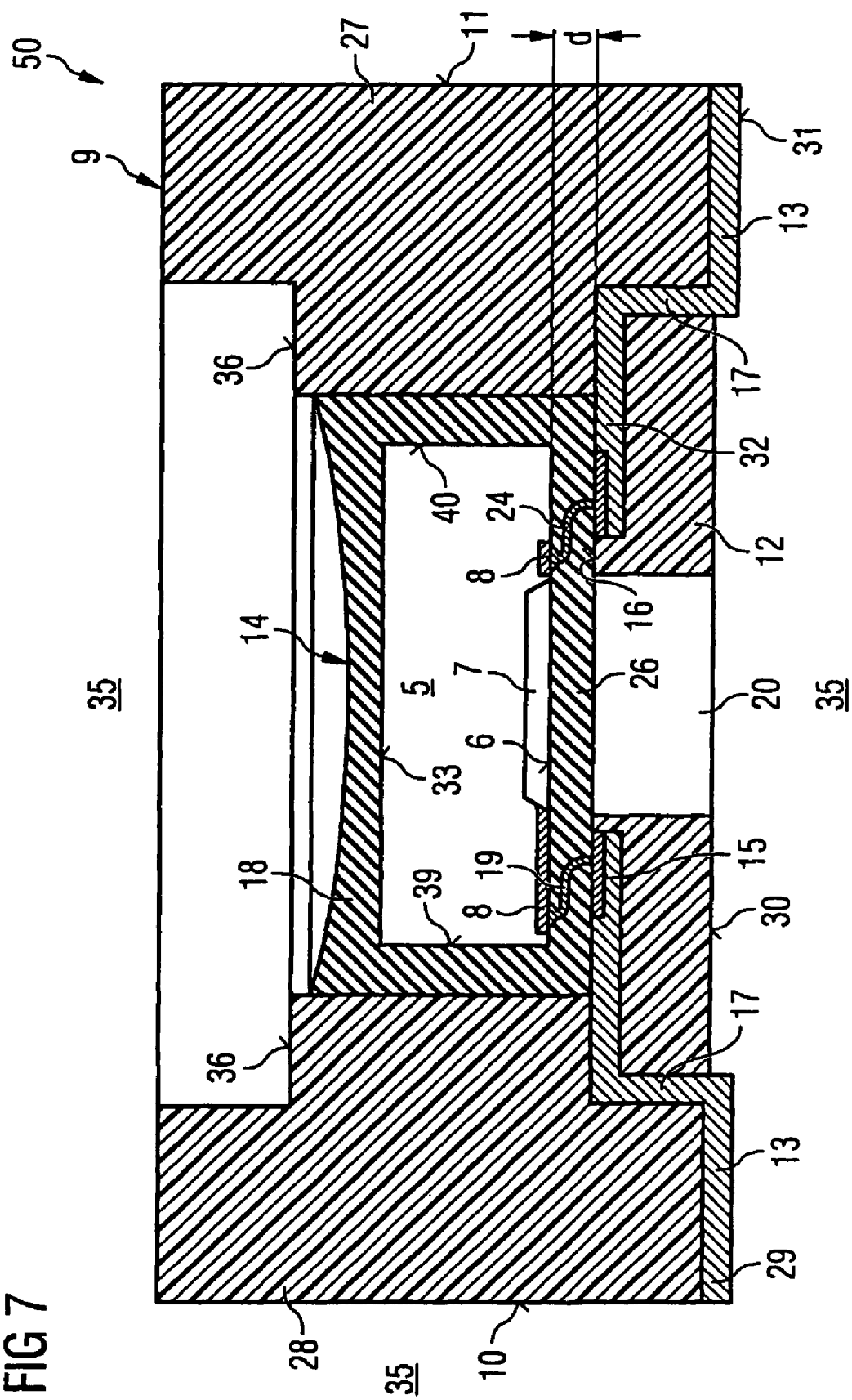
FIG. 7 shows a schematic cross section through a semiconductor sensor device in accordance with a fifth embodiment.
Figure 8:
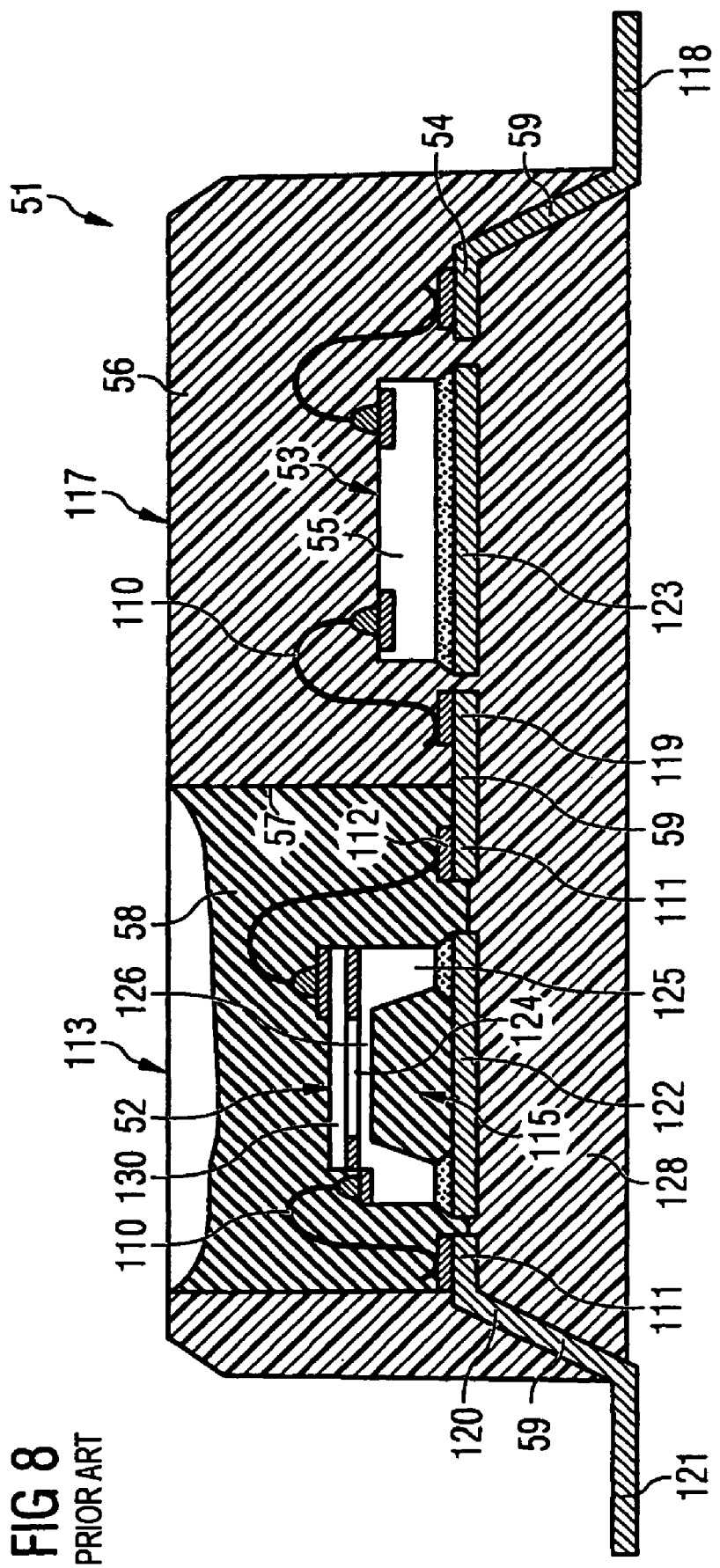
FIG. 8 shows a schematic cross section through a microelectromechanical module comprising a sensor in accordance with the prior art.

FIG. 7 shows a schematic cross section through a semiconductor sensor device 50 in accordance with a fifth embodiment. The fifth embodiment differs from the previous embodiments in that bonding wire portions 24 which are bent in S-shaped fashion and thereby have a high elasticity and compliance are used as elastic flip-chip contacts. In order to intensify the elasticity, the bonding wires are coated with a spring-elastic material, e.g., a spring bronze.

In this embodiment, coating of the bonding wires is carried out subsequent to the shaping of the bonding wire portions 24 to form S-shaped bonding wire ends. This has the advantage that during the actual shaping of the bonding wire portion, the bonding wire material made of gold or aluminum is plastically deformable and the spring stiffness is achieved via the coating with a spring-elastic material, e.g., a spring bronze. In this embodiment, the S-shaped bent bonding wire portion 24 with coating is subsequently connected to the contact pad 15 on the internal flat conductor via a conductive adhesive in order that the lowest possible forces are exerted on the sensitive sensor chip 5 even during the mounting of the semiconductor sensor device.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A semiconductor sensor device, comprising:
    a sensor chip including a sensor region and contact areas disposed on an upper side of the sensor chip;
    a cavity housing comprising side walls, a housing bottom and a cavity disposed between the side walls and housing bottom;
    a leadframe comprising external contacts disposed outside the cavity of the cavity housing, wherein the external contacts comprise external flat conductors arranged on an underside of the housing bottom, the leadframe further comprising contact pads disposed on an upper side of the housing bottom facing the cavity, the contact pads being electrically connected to the external contacts via through contacts, wherein the external flat conductors comprise external contact areas that undergo a transition from the underside of the housing bottom to the through contacts that extend through the housing bottom and that undergo a further transition from the through contacts to the contact pads;
    elastic flip-chip contacts; and
    a rubber-elastic plastic composition disposed within the cavity, wherein the sensor chip is at least partly embedded in the rubber-elastic plastic composition, the sensor region is arranged facing the housing bottom, the contact areas are electrically connected to the elastic flip-chip contacts, the elastic flip-chip contacts are electrically connected to the contact pads, and the rubber-elastic plastic composition includes a section that is disposed over the sensor region and has a thickness that is defined between the upper side of the sensor chip and the upper side of the housing bottom.

2. The semiconductor sensor device of claim 1, wherein the housing bottom comprises at least one housing bottom opening.

3. The semiconductor sensor device of claim 1, wherein each elastic flip-chip contact comprises a rubber-elastic plastic hump and a conduction path, the conduction path being arranged on the rubber-elastic plastic hump extending from a base of the hump to a hump peak.

4. The semiconductor sensor device of claim 1, wherein the elastic flip-chip contacts comprise spring-elastic bonding wires.

5. The semiconductor sensor device of claim 1, wherein the elastic flip-chip contacts comprise electrodeposited elastic fibers.

6. The semiconductor sensor device of claim 2, wherein an areal extent of the housing bottom opening is dimensioned to an area of the sensor region.

7. The semiconductor sensor device of claim 1, wherein the housing bottom comprises a plurality of housing bottom openings operatively connected to the sensor region of the sensor chip via the rubber-elastic plastic composition.

8. The semiconductor sensor device of claim 1, wherein the rubber-elastic plastic composition comprises a silicone gel.

9. The semiconductor sensor device of claim 1, wherein the rubber-elastic plastic composition is optically transparent.

10. The semiconductor sensor device of claim 1, wherein a uniformly thick layer of the rubber-elastic plastic composition is arranged between the upper side of the housing bottom and the sensor region.

11. The semiconductor sensor device of claim 10, wherein the side walls form an injection-molding frame comprising a filled plastic housing composition.

12. The semiconductor sensor device of claim 1, wherein the elastic flip-chip contacts are embedded within the rubber-elastic plastic composition.

13. The semiconductor sensor device of claim 1, wherein the section of the rubber-elastic plastic composition that is disposed over the sensor region has a thickness defined between the upper side of the sensor chip and the upper side of the housing bottom that enhances sensitivity of the sensor chip.

14. The semiconductor sensor device of claim 1, wherein the rubber-elastic plastic composition is filled within the housing cavity so as to cover the upper side of the sensor chip and also at least a majority of edge sides that extend between the upper side and a side opposing the upper side of the sensor chip.

15. The semiconductor sensor device of claim 1, wherein the sensor chip is completely embedded within the rubber-elastic plastic composition such that the upper side and a side opposing the upper side of the sensor chip are covered with the rubber-elastic plastic composition.

16. The semiconductor sensor device of claim 1, wherein the elastic flip-chip contacts comprise bonding wires that extend between the contact areas of the sensor chip and the contact pads of the leadframe, and the bonding wires are bent and have an S shape.

* * * * *